United States Patent
Kanamura et al.

(10) Patent No.: US 8,912,571 B2
(45) Date of Patent: Dec. 16, 2014

(54) COMPOUND SEMICONDUCTOR DEVICE INCLUDING FIRST FILM ON COMPOUND SEMICONDUCTOR LAYER AND SECOND FILM ON FIRST FILM AND METHOD OF MANUFACTURING THE SAME

(75) Inventors: Masahito Kanamura, Kawasaki (JP); Toshihide Kikkawa, Kawasaki (JP); Kenji Imanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 293 days.

(21) Appl. No.: 13/294,654

(22) Filed: Nov. 11, 2011

(65) Prior Publication Data

US 2012/0138944 A1 Jun. 7, 2012

(30) Foreign Application Priority Data

Dec. 3, 2010 (JP) ................................. 2010-270802

(51) Int. Cl.
| | | |
|---|---|---|
| *H01L 29/66* | (2006.01) | |
| *H01L 21/338* | (2006.01) | |
| *H01L 29/51* | (2006.01) | |
| *H01L 29/778* | (2006.01) | |
| *H01L 29/417* | (2006.01) | |

(52) U.S. Cl.
CPC ....... *H01L 29/7787* (2013.01); *H01L 29/41766* (2013.01); *H01L 29/513* (2013.01); *H01L 29/66462* (2013.01); *H01L 29/472376* (2013.01)
USPC .......................................... 257/194; 438/172

(58) Field of Classification Search
None
See application file for complete search history.

(56) References Cited

U.S. PATENT DOCUMENTS

| | | | |
|---|---|---|---|
| 7,019,336 B2 | 3/2006 | Yamashita et al. | |
| 2008/0006845 A1 | 1/2008 | Derluyn et al. | |
| 2008/0093626 A1 | 4/2008 | Kuraguchi | |
| 2008/0176366 A1 | 7/2008 | Mita et al. | |
| 2008/0308843 A1* | 12/2008 | Twynam | 257/191 |

FOREIGN PATENT DOCUMENTS

| | | |
|---|---|---|
| CN | 101183647 A | 5/2008 |
| JP | 2005-86171 A | 3/2005 |
| JP | 2006-278857 A | 10/2006 |
| JP | 2007-329483 | 12/2007 |
| JP | 2008-084942 A | 4/2008 |
| JP | 2008-103617 | 5/2008 |
| WO | WO-2010/014128 A2 | 2/2010 |

OTHER PUBLICATIONS

Yu et al., "Measurement of piezoelectrically induced charge in GaN/AlGaN heterostructure field-effect transistors", Appl. Phys. Lett. 71 (19), Nov. 10, 1997.*
Chinese Office Action mailed Jan. 2, 2014 for corresponding Chinese Application No. 201110402797.4, with English-language Translation.
JPOA—Office Action of Japanese Patent Application No. 2010-270802 dated Oct. 21, 2014 with Partial Translation.

\* cited by examiner

Primary Examiner — Daniel Luke
(74) Attorney, Agent, or Firm — Fujitsu Patent Center

(57) ABSTRACT

A compound semiconductor device includes: a compound semiconductor layer; a first film formed over the compound semiconductor layer, the first film being in a negatively charged state or a non-charged state at an interface with the compound semiconductor layer; a second film formed over the first film, the second film being in a positively charged state at an interface with the first film; and a gate electrode to be embedded in an opening formed in the second film.

13 Claims, 9 Drawing Sheets

COMPOUND SEMICONDUCTOR DEVICE INCLUDING FIRST FILM ON COMPOUND SEMICONDUCTOR LAYER AND SECOND FILM ON FIRST FILM AND METHOD OF MANUFACTURING THE SAME

CROSS-REFERENCE TO RELATED APPLICATION

This application is based upon and claims the benefit of priority of the prior Japanese Patent Application No. 2010-270802, filed on Dec. 3, 2010, the entire contents of which are incorporated herein by reference.

FIELD

The present disclosure relates to a compound semiconductor device and a method of manufacturing the compound semiconductor device.

BACKGROUND

Nitride semiconductor devices have been extensively developed as semiconductor devices with high withstand voltage and output by utilizing their characteristics such as a high saturated electron velocity and a wide band gap. Many reports have been made regarding field-effect transistors, especially high electron mobility transistors (HEMTs). AlGaN/GaN HEMT, in particular, has been receiving much attention, with GaN as an electron transport layer and AlGaN as an electron supply layer. AlGaN/GaN HEMT has a strain at a layer including AlGaN caused by a difference in lattice constants between GaN and AlGaN. The piezoelectric polarization and spontaneous polarization of AlGaN are induced thereby, thus generating two-dimensional electron gas (2DEG) at high concentration. Accordingly, high withstand voltage and output can be achieved.

Related techniques are disclosed in Japanese Unexamined Patent Application Publication Nos. 2007-329483, 2005-86171, and 2006-278857.

SUMMARY

According to an aspect of the invention, a compound semiconductor device includes: a compound semiconductor layer; a first film formed over the compound semiconductor layer, the first film being in a negatively charged state or a non-charged state at an interface with the compound semiconductor layer; a second film formed over the first film, the second film being in a positively charged state at an interface with the first film; and a gate electrode to be embedded in an opening formed in the second film.

According to another aspect of the invention, a method of manufacturing a compound semiconductor device, includes: forming a first film over a compound semiconductor layer, the first film being a negatively-charged state or a non-charged state at an interface with the compound semiconductor layer; forming a second film over the first film, the second film being a positively-charged state at an interface with the first film; forming an opening in the second film; and forming a gate electrode to be embedded in the opening.

The object and advantages of the invention will be realized and attained by at least those elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
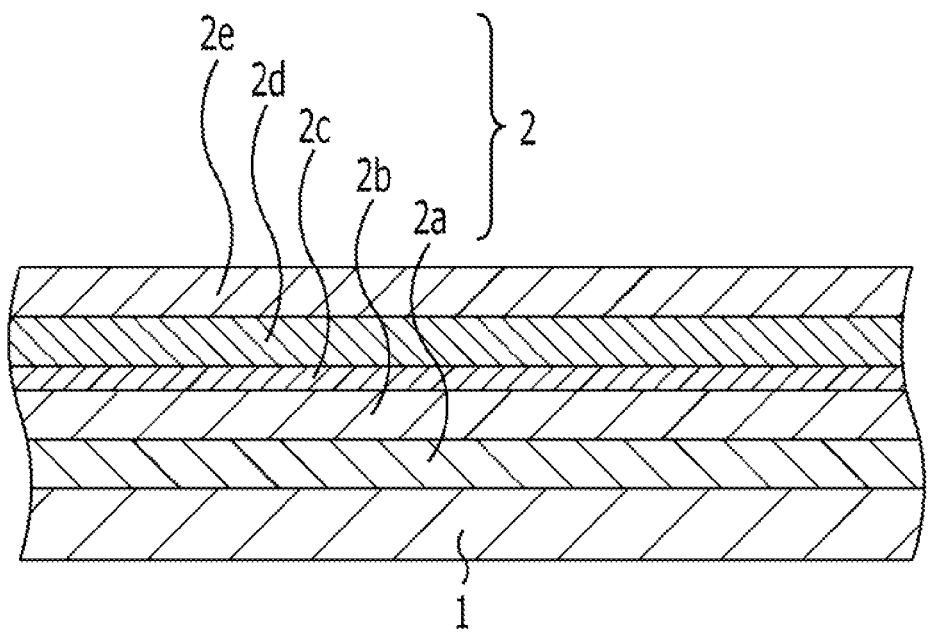
FIGS. 1A to 1H are sectional views illustrating a method of manufacturing an AlGaN/GaN HEMT of a metal insulator semiconductor (MIS) structure (hereinafter referred to as "AlGaN/GaN MIS-HEMT") in accordance with Embodiment 1.

In the application of a nitride semiconductor device to a power supply, it is desirable to develop normally-off devices which have a low loss and a high withstand voltage and in which current does not flow when a gate voltage is off. AlGaN/GaN HEMT has a number of electrons in an electron transport layer as 2DEG due to the piezoelectric effect. The effect plays a significant role in achieving a large current operation. However, when a device has a simple structure, the device may become a normally-on device, because an electron transport layer has a number of electrodes immediately under a gate electrode even when gate voltage is off. Thus, a gate recess structure has been examined in which an electrode trench is formed by etching an electron supply layer (or both electron supply layer and electron transport layer) at a gate so as to reduce electrons in the electron transport layer, thus raising a threshold.

However, it may be difficult to perform dry etching precisely on a nitride-based semiconductor such as GaN or AlGaN to have a recess structure. Thus, manufactured HEMTs may have a large variation in their transistor characteristics.

Embodiments will be described in detail below with reference to the attached drawings.

Some components may not necessarily be illustrated in the drawings in an accurate scale in relation to others for practical purposes.

Embodiment 1

This embodiment discloses an AlGaN/GaN MIS-HEMT as a compound semiconductor device.

FIGS. 1A to 1H are sectional views illustrating a method of manufacturing an AlGaN/GaN MIS-HEMT in accordance with Embodiment 1.

As illustrated in FIG. 1A, a compound semiconductor layer 2 is formed over, for example, a semi-insulating SiC substrate 1 as a substrate for growth.

The compound semiconductor layer 2 includes a buffer layer 2a, an electron transport layer 2b, an intermediate layer 2c, an electron supply layer 2d, and a cap layer 2e.

Over the SiC substrate 1, each compound semiconductor is grown by, for example, metal organic vapor phase epitaxy (MOVPE). Instead of MOVPE, molecular beam epitaxy (MBE) or the like may be used.

Over the SiC substrate 1, AlN, i (intentionally undoped)-GaN, i-AlGaN, n-AlGaN, and n-GaN are deposited to form the buffer layer 2a, the electron transport layer 2b, the intermediate layer 2c, the electron supply layer 2d, and the cap layer 2e, respectively. As conditions for growing AlN, GaN, AlGaN and GaN, for example, a mixed gas of trimethyl aluminum gas, trimenthyl gallium gas and ammonia gas is used as a source gas. Depending on the type of a compound semiconductor layer to be grown, supply and flow rates of trimethyl aluminum gas as an Al source, and trimethyl gallium gas as a Ga source are appropriately chosen. The flow rate of ammonia gas as a common material is about, for example, 100 ccm to 10 LM. Moreover, the growth pressure is about 50 to 300 Torr and the growth temperature is about 1,000 to 1,200° C.

When growing GaN and AlGaN as an n-type, $51H_4$ gas containing Si, for example, is added to a source gas as an n-type impurity at a certain flow rate, and GaN and AlGaN are doped with Si. Concentration of doped Si is, for example, about $1 \times 10^{18}/cm^3$ to $1 \times 10^{20}/cm^3$, and preferably about $5 \times 10^{18}/cm^3$.

For example, the buffer layer 2a is about 0.1 μm thick, the electron transport layer 2b is about 3 μm thick, the intermediate layer 2c is about 5 nm thick, and the cap layer 2e is about 10 nm thick. For example, the electron supply layer 2d has a thickness of about 1 to 10 nm, and is about 5 nm thick herein. $Al_xGa_{1-x}N$ has an Al ratio x of 0.1 to 0.15, and about 0.1 in the ratio herein. When the electron supply layer 2d is thinner than 1 nm, it may be difficult to form an AlGaN with high crystallinity. When the electron supply layer 2d is thicker than 10 nm, 2DEG may be generated at the electron transport layer 2b while the surface of the compound semiconductor layer 2 is exposed. If the Al ratio of the electron supply layer 2d is less than 0.1, a conduction band at an interface between the intermediate layer 2c and the electron transport layer 2b would have a smaller discontinuity and the mobility of electrons might actually decrease. If the Al ratio of the electron supply layer 2d is larger than 0.15, 2DEG may be generated at the electron transport layer 2b while the surface of the compound semiconductor layer 2 is exposed. By forming the electron supply layer 2d within the above-described range of thickness and with the composition described above, an amount of 2DEG generated at the electron transport layer 2b is reduced in a state when the surface of the compound semiconductor layer 2 is exposed, that is, components are formed over the compound semiconductor layer 2 as illustrated in FIG. 1A.

Figure 1B:
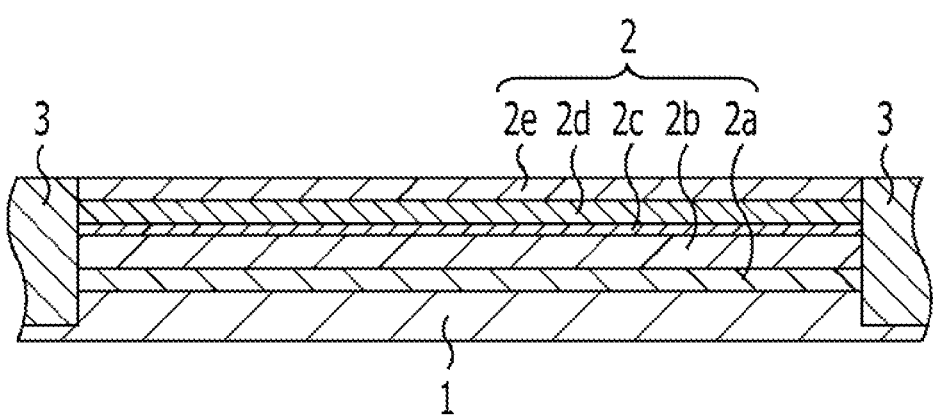

Subsequently, an element isolation structure 3 is formed as illustrated in FIG. 1B.

For example, argon (Ar) is injected into the element isolation region of the compound semiconductor layer 2. Accordingly, the element isolation structure 3 is formed at the compound semiconductor layer 2 and the SiC substrate 1. Active regions are defined at the compound semiconductor layer 2 by the element isolation structure 3.

The element isolation structure 3 may be formed by, for example, shallow trench isolation (STI) instead of the injection described above.

Figure 1C:
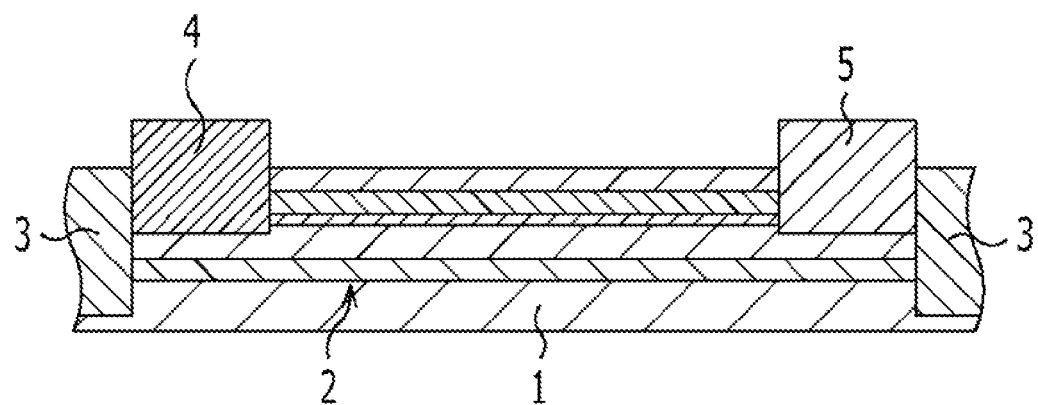

Subsequently, a source electrode 4 and a drain electrode 5 are formed as illustrated in FIG. 1C.

First, an electrode trench is formed at each of the cap layer 2e, the electron supply layer 2d, the intermediate layer 2c and the electron transport layer 2b at the locations where the source electrode and the drain electrode are to be formed at the surface of the compound semiconductor layer 2.

A resist mask is formed so as to form an opening at the locations where the source electrode and the drain electrode are to be formed at the surface of the compound semiconductor layer 2. The cap layer 2e, the electron supply layer 2d, the intermediate layer 2c and a surface portion of the electron transport layer 2b at the locations are removed by dry etching using the resist mask. Accordingly, the electrode trenches are formed. For etching, inactive gas such as Ar or chlorine gas such as $Cl_2$ is used as etching gas. The flow rate of $Cl_2$ is 30 sccm, the pressure thereof is 2 Pa, and the RF input power is 20 W.

Ta/Al is used as a material for the electrodes. A two-layer resist having the eaves structure, for example, is used to form the electrodes since it is suitable for the deposition or lift-off. The resist is coated over the compound semiconductor layer 2, thus forming a resist mask to open an electrode trench. Ta/Al is deposited by using the resist mask. The thickness of Ta is about 20 nm, and that of Al is about 200 nm. The resist mask having the eaves structure and the Ta/Al deposited thereover are removed by the lift-off. Subsequently, the SiC substrate 1 is treated with heat in, for example, a nitrogen atmosphere at about 600° C. so as to ohmically contact the remaining Ta/Al to the electron transport layer 2b, thereby forming the source electrode 4 and the drain electrode 5.

Figure 1D:
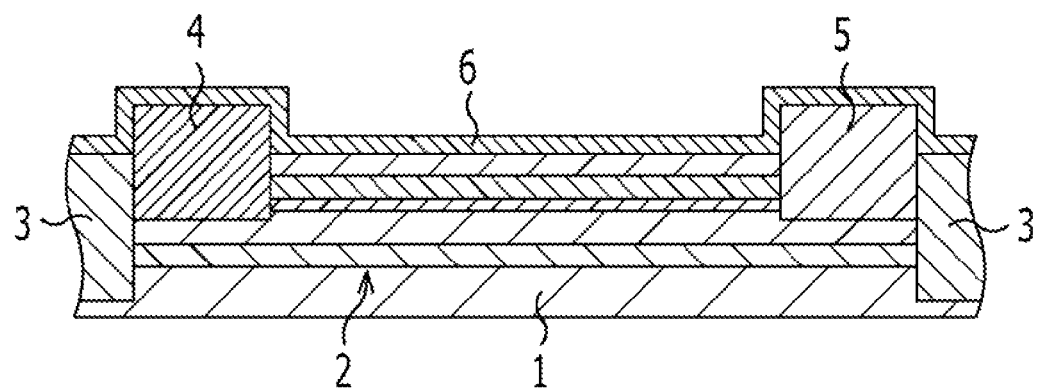

A first film 6 is then formed as illustrated in FIG. 1D.

For example, an aluminum nitride (AlN) is deposited as an insulating material having a first characteristic so as to cover the surface of the compound semiconductor layer 2 (cap layer 2e), thus forming the first film 6. The first characteristic is the one in which the first film 6 is at a negatively-charged or non-charged state at an interface between the first film 6 and the surface of the compound semiconductor layer 2 when the first film 6 is formed over the compound semiconductor layer 2. AlN is formed by, for example, atomic layer deposition (ALD), and the film thickness is about 1 to 100 nm, or more preferably about 10 to 50 nm. AlN has the thickness of about 20 nm herein. When AlN is thicker than 100 nm, the above-described first characteristic may be insufficiently achieved in relation to the compound semiconductor layer 2. When AlN is thinner than 1 nm, it may insufficiently function as a gate insulating film. By forming AlN within the above-described range of the thickness, the first characteristic may be obtained without losing its properties as a gate insulating film. Since AlN is formed by ALD, polycrystalline AlN is formed. In this embodiment, the first film 6 serves as a gate insulating film as described below.

The first film 6 formed thereby has the first characteristic described above. Thus, at the state illustrated in FIG. 1D in which the first film 6 is formed over the compound semiconductor layer 2, substantially no 2DEG is generated at the electron transport layer 2b.

Figure 1E:
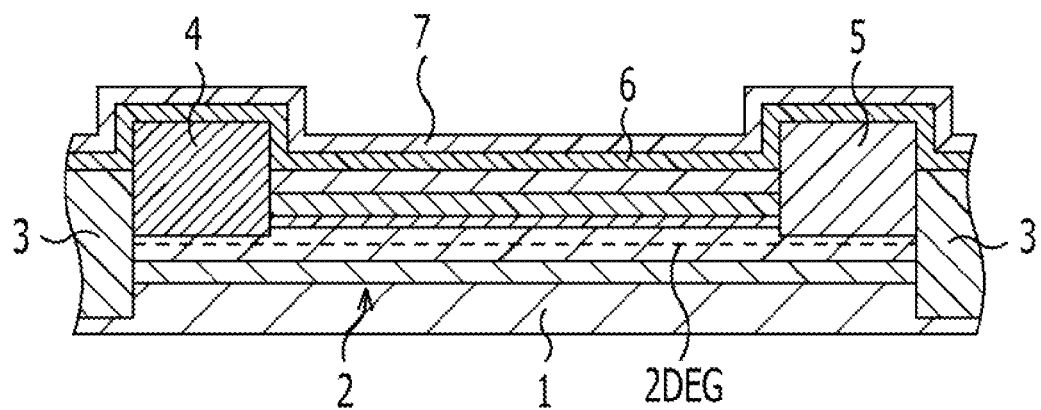

Subsequently, a second film 7 is formed as illustrated in FIG. 1E.

For example, alumina ($Al_2O_3$) is deposited as an insulating material having a second characteristic over the first film 6, thus forming the second film 7. The second characteristic is the one in which the second film 7 is at a positively-charged state at an interface between the second film 7 and the surface of the first film 6 when the second film 7 is stacked over the first film 6. For example, $Al_2O_3$ is deposited over AlN that was formed as illustrated in FIG. 1D, by ALD to a thickness of about 1 to 500 nm. $Al_2O_3$ has the thickness of about 40 nm herein. When $Al_2O_3$ is thinner than 1 nm, the above-described second characteristic may be insufficiently achieved in relation to the compound semiconductor layer 2. When $Al_2O_3$ is thicker than 500 nm, physical and electrical deterioration due to stress may be caused. By forming $Al_2O_3$ within the range of the thickness described above, the second characteristic can be obtained without physical and electrical deterioration caused by stress. Instead of $Al_2O_3$, the second film 7 may include a material including at least one compound selected from the group consisting of aluminum oxynitride, silicon oxide, silicon nitride, silicon oxynitride, boron nitride, hafnium oxide, hafnium nitride and hafnium oxynitride.

After $Al_2O_3$ is deposited, a heat treatment may be carried out at a temperature of about 350 to 1,000° C.

The second film 7 has the second characteristic described above. Therefore, 2DEG (illustrated in a broken line in FIG. 1E) is generated at the electron transport layer 2b when the second film 7 is formed over the first film 6, or specifically when the first film 6 and the second film 7 are stacked over the compound semiconductor layer 2 as in the figure.

Figure 1F:
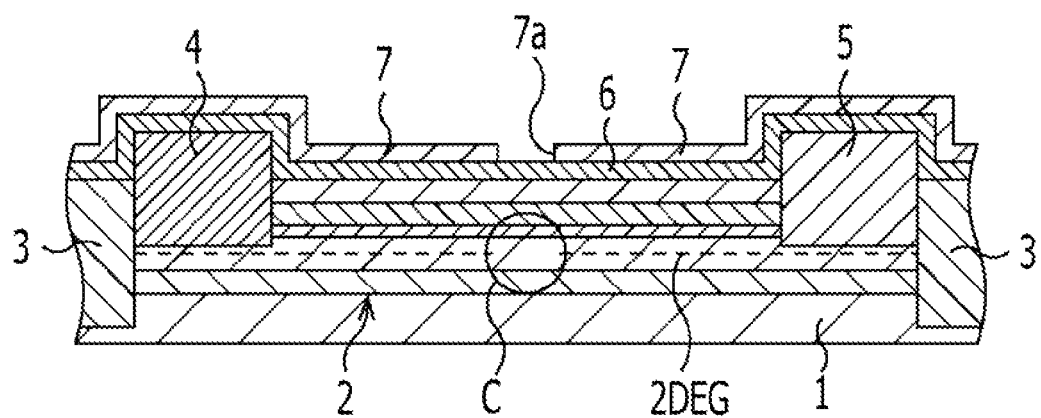

Subsequently, an opening 7a is formed in the second film 7 as illustrated in FIG. 1F.

First, a resist is coated over the second film 7. The resist is treated by lithography, thereby forming an opening at the location where a gate electrode is to be formed. A resist mask is thus formed so as to expose from the opening the surface of the second film 7 that corresponds to the location where a gate electrode is to be formed.

The second film 7 is etched by using the resist mask until the surface of the first film 6 is exposed. Dry etching using fluorine-based gas as an etching gas, and wet etching using a fluorine etchant are carried out. The opening 7a is thus formed in the second film 7.

The resist mask is removed by ashing or the like.

When the opening 7a is formed in the second film 7 as illustrated in FIG. 1F, the second film 7 having the above-described second characteristic is removed at the opening 7a. There is only the first film 6 at the opening 7a over the compound semiconductor layer 2. Thus, 2DEG at the electron transport layer 2b dissipates at a region below the opening 7a (illustrated as a circle C in the figure).

Figure 1G:
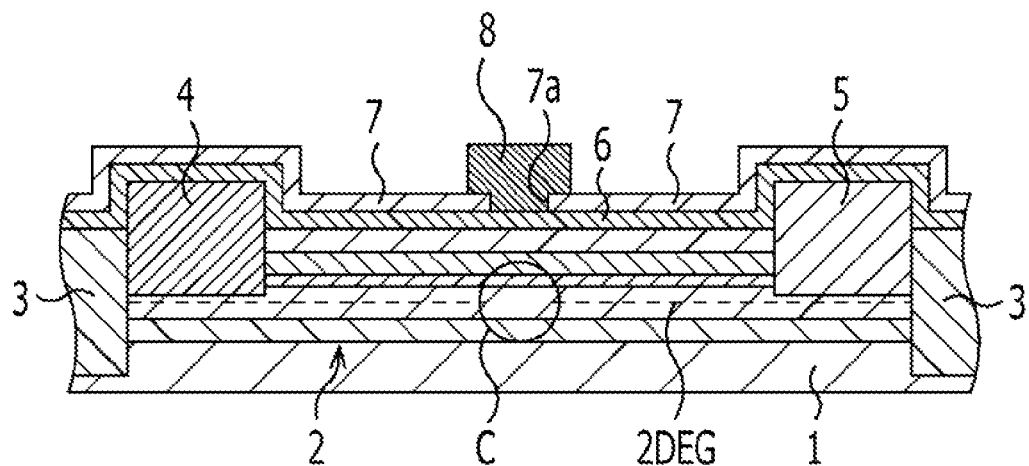

A gate electrode 8 is then formed as illustrated in FIG. 1G.

First, a lower layer resist (for example, PMGI (trade name) of MicroChem. Corp.) and an upper layer resist (for example, PFI32-A8 (trade name) of Sumitomo Chemical Co., Ltd.) are coated over the second film 7, including the opening 7a. An opening of, for example, about 0.8 µm in diameter is formed in the upper layer resist by an ultraviolet ray exposure at the location where a gate electrode is to be formed including the opening 7a. Then, the lower layer resist is wet-etched with an alkali developer while using the upper layer resist as a mask. Subsequently, while the upper layer resist and the lower layer resist are used as a mask, a gate metal of Ni/Au in which Ni is about 10 nm thick and Au is about 300 nm thick, is deposited over an entire surface, including the inside of the opening. Then, lift-off is carried out with a heated organic solvent, thereby removing the lower layer resist, the upper layer resist, and the gate metal on the upper layer resist. The gate electrode 8 is thus formed in which the opening 7a is embedded with a portion of the gate metal. The first film 6 is between the surface of the compound semiconductor layer 2 and the gate electrode 8, and the first film 6 serves as a gate insulating film.

Figure 1H:
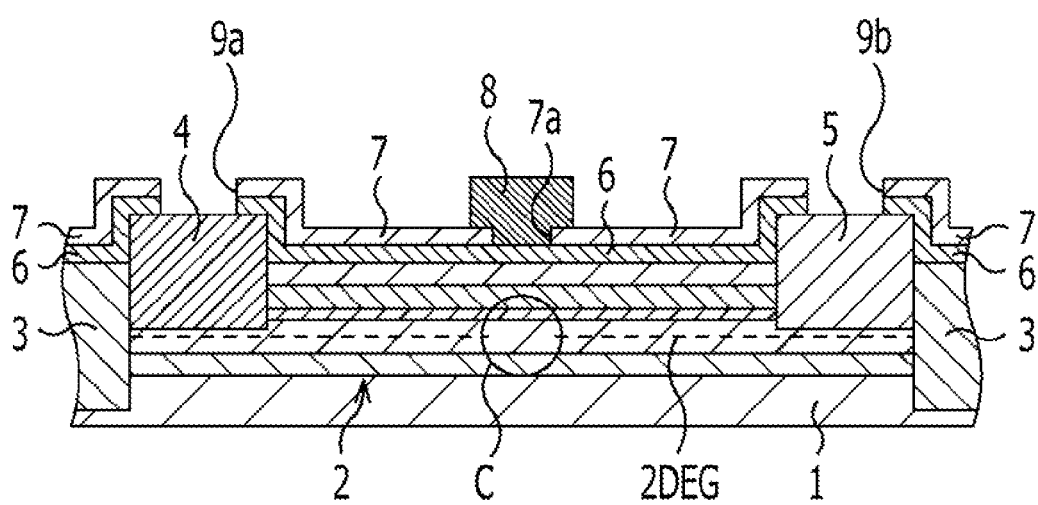

As illustrated in FIG. 1H, a contact hole 9a for a source electrode 4 and a contact hole 9b for a drain electrode 5 are formed in the first film 6 and the second film 7.

The contact holes 9a and 9b are formed in the second film 7 and the first film 6 so as to expose a portion of the surface of the source electrode 4 and the drain electrode 5 by lithography and dry etching.

Instead, a certain protective film may be first formed over the second film 7 so as to cover the gate electrode 8, and each contact hole may be formed in the protective film, the second film 7 and the first film 6.

After wiring the source electrode 4, the drain electrode 5 and the gate electrode 8, an AlGaN/GaN MIS-HEMT is formed.

When voltage is not applied to the gate electrode 8 (in an OV state) as illustrated in FIG. 1H, 2DEG at the electron transport layer of the compound semiconductor layer 2 dissipates at a region below the gate electrode 8 that corresponds to a channel region (illustrated in a circle C in the figure). This indicates that normally-off is achieved at AlGaN/GaN HEMT in the embodiment.

The generation of 2DEG when forming the second film 7 over the first film 6 described above will be described by referring to experiments. In the experiments, a so-called CV characterization was carried out so as to measure the electric capacitance of an evaluation target.

Figure 2A:
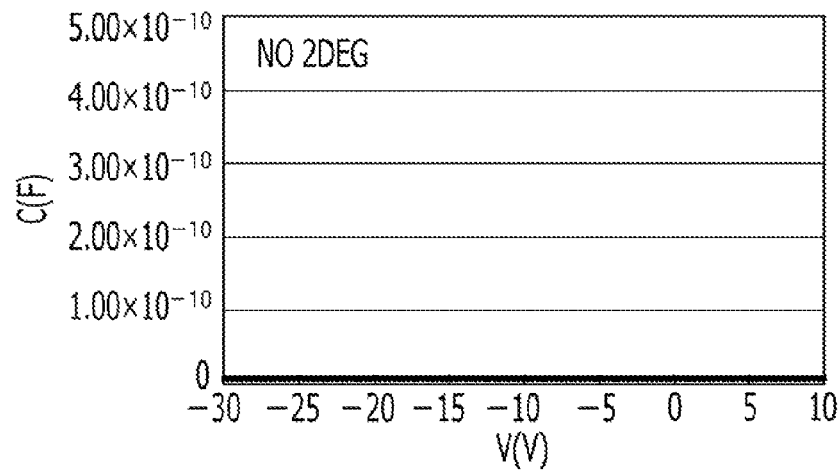
FIGS. 2A to 2C are graphs illustrating the experimental results on 2DEG that is generated when a second film is formed over a first film.

First, in a state where the first film 6 was not yet formed over the compound semiconductor layer 2 as illustrated in FIG. 1C, an electric capacitance between the SiC substrate 1 and a surface electrode over the compound semiconductor layer 2 was measured. The results are illustrated in FIG. 2A. In this case, even if voltage is applied between the channel and the surface electrode, there is no change in electric capacitance. Thus, it is found that 2DEG may not generated when no first film 6 is formed over the compound semiconductor layer 2.

Figure 2B:
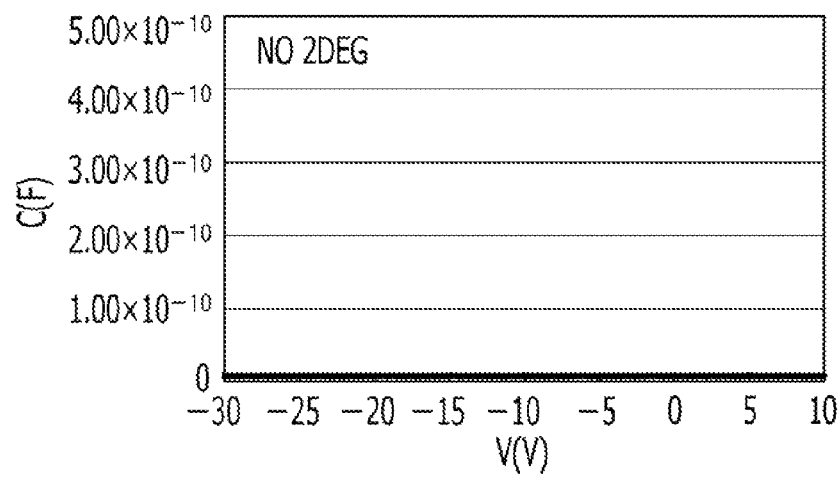

Subsequently, in a state where the first film 6 was formed and the second film 7 was not yet formed over the compound semiconductor layer 2 as illustrated in FIG. 1D, electric capacitance between the SiC substrate 1 and an electrode over the first film 6 was measured. The results are illustrated in FIG. 2B. Like FIG. 2A, even if voltage is applied between the SiC substrate 1 and the electrode over the first film 6, there may no change in the electric capacitance. Thus, it is realized that no 2DEG may be generated when only the first film 6 is formed over the compound semiconductor layer 2.

Figure 2C:
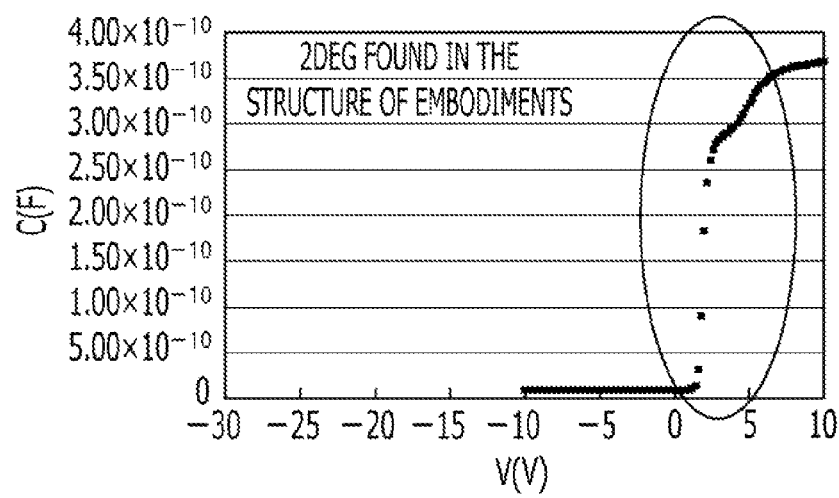

In a state where the first film 6 and the second film 7 were stacked over the compound semiconductor layer 2 as illustrated in FIG. 1E, electric capacitance between the SiC substrate 1 and an electrode over the second film 7 was measured. The results are illustrated in FIG. 2C. In this case, when voltage was applied between the SiC substrate 1 and the electrode over the second film 7, there was a significant change in the electric capacitance. Thus, it is realized that 2DEG is generated when the first film 6 and the second film 7 are stacked over the compound semiconductor layer 2.

As described above, a highly reliable AlGaN/GaN HEMT is provided according to the embodiment that can perform a normally-off operation with a relatively simple structure even without a trench for a gate electrode at the compound semiconductor layer 2.

Embodiment 2

This embodiment also discloses an AlGaN/GaN MIS-HEMT as a compound semiconductor device as in Embodiment 1, but this embodiment is different from Embodiment 1 in that the gate insulating film has a different composition.

Figure 3A:
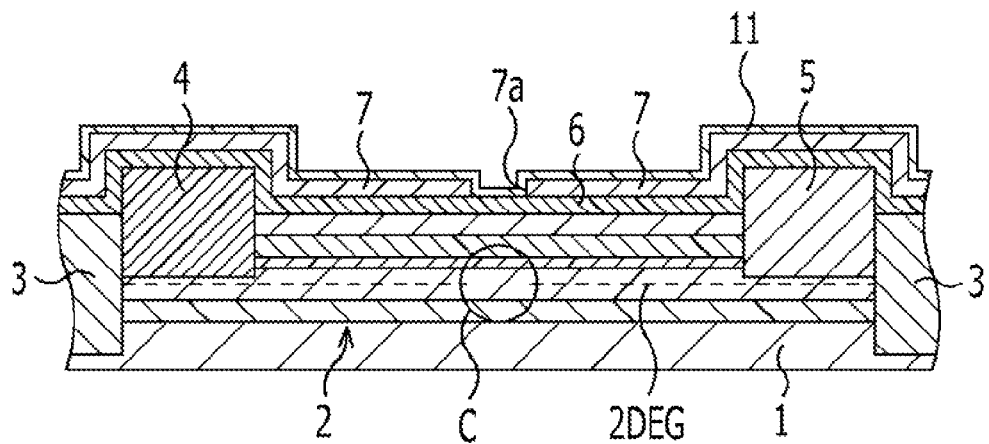
FIGS. 3A to 3C are sectional views illustrating major steps of forming an AlGaN/GaN MIS-HEMT in accordance with Embodiment 2.
Figure 3B:
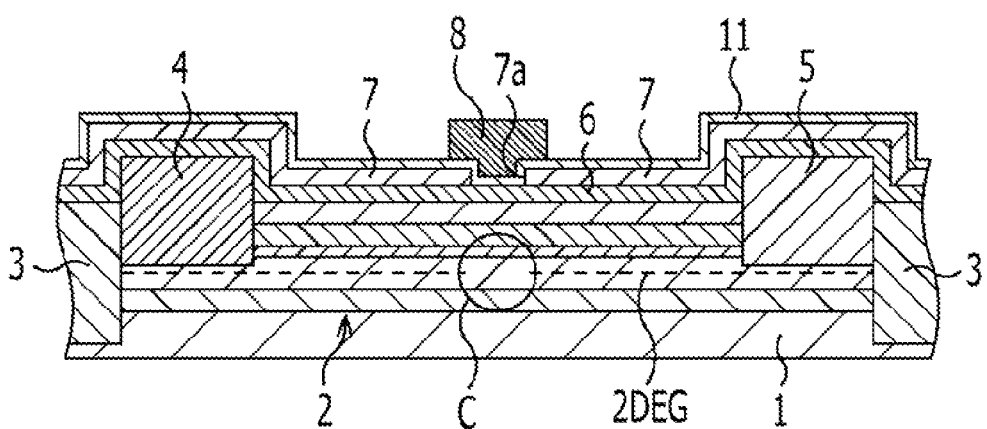
Figure 3C:
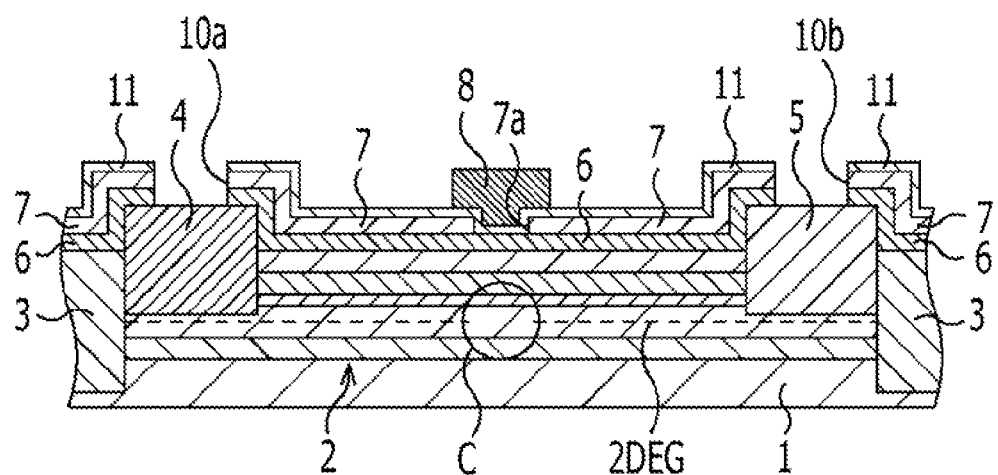

FIGS. 3A to 3C are sectional views illustrating major steps of forming an AlGaN/GaN MIS-HEMT in accordance with Embodiment 2.

First, the opening 7a is formed in the second film 7 through the steps illustrated in FIGS. 1A to 1F as in Embodiment 1.

Subsequently, a third film 11 is formed over the second film 7 as illustrated in FIG. 3A.

The third film 11 is formed over the second film 7 so as to cover the inside wall surface of the opening 7a. An insulating material, such as silicon nitride (SiN), is used as a material for the third film 11, and is deposited at about 40 nm in thickness by, for example, CVD. Instead of SiN, the material may contain at least one compound selected from the group consisting of aluminum oxide, aluminum oxynitride, silicon oxide, silicon oxynitride, boron nitride, hafnium oxide, hafnium nitride and hafnium oxynitride.

Even if the third film 11 is formed, 2DEG at the electron transport layer 2b over the compound semiconductor layer 2 remains the same and dissipates only at a region below the opening 7a (illustrated in a circle C in FIG. 3A).

Subsequently, a gate electrode 8 is formed as illustrated in FIG. 3B.

First, a lower layer resist (for example, PMGI (trade name) of MicroChem. Corp.) and an upper layer resist (for example, PFI32-A8 (trade name) of Sumitomo Chemical Co., Ltd.) are coated over the third film 11 by, for example, spin coating. An opening of, for example, about 0.8 μm in diameter is formed in the upper layer resist by an ultraviolet ray exposure at the location where a gate electrode is to be formed including the opening 7a. Then, the lower layer resist is wet-etched with an alkali developer with the upper layer resist as a mask. Subsequently, while the upper layer resist and the lower layer resist are used as a mask, a gate metal of Ni/Au in which Ni is about 10 nm thick and Au is about 300 nm thick, is deposited over an entire surface including the opening. Then, lift-off is carried out with a heated organic solvent, thereby removing the lower layer resist, the upper layer resist, and the gate metal over the upper layer resist. The gate electrode 8 is thus formed in which the opening 7a is embedded with a portion of the gate metal. The first film 6 and the third film 11 are provided between the surface of the compound semiconductor layer 2 and the gate electrode 8, and a stacked film of the first film 6 and the third film 11 serves as a gate insulating film.

In this embodiment, the second film 7 is coated with the third film 11 that serves as a protective film. Moreover, since the stack of the first film 6 and the third film 11 serves as the gate insulating film, the stack is optimized as a gate insulating film due to the third film 11, thus providing desirable gate characteristics.

As illustrated in FIG. 3C, a contact hole 10a for a source electrode 4 and a contact hole 10b for a drain electrode 5 are formed in the first film 6, the second film 7 and the third film 11.

The contact holes 10a and 10b are formed in the third film 11, the second film 7 and the first film 6 so as to expose a portion of the surface of the source electrode 4 and the drain electrode 5 by lithography and dry etching.

After wiring the source electrode 4, the drain electrode 5 and the gate electrode 8, AlGaN/GaN MIS-HEMT is formed.

When voltage is not applied to the gate electrode 8 (in an 0V state) as illustrated in FIG. 3C, 2DEG at the electron transport layer of the compound semiconductor layer 2 dissipates at a region below the gate electrode 8 that corresponds to a channel region (illustrated in a circle C in FIG. 3C). This indicates that normally-off is achieved at AlGaN/GaN HEMT in the embodiment.

As described above, a highly reliable AlGaN/GaN HEMT is provided according to the embodiment that can perform a normally-off operation with a relatively simple structure even without a trench for a gate electrode at the compound semiconductor layer 2.

Embodiment 3

This embodiment discloses an AlGaN/GaN Schottky-HEMT as a compound semiconductor device.

Figure 4A:
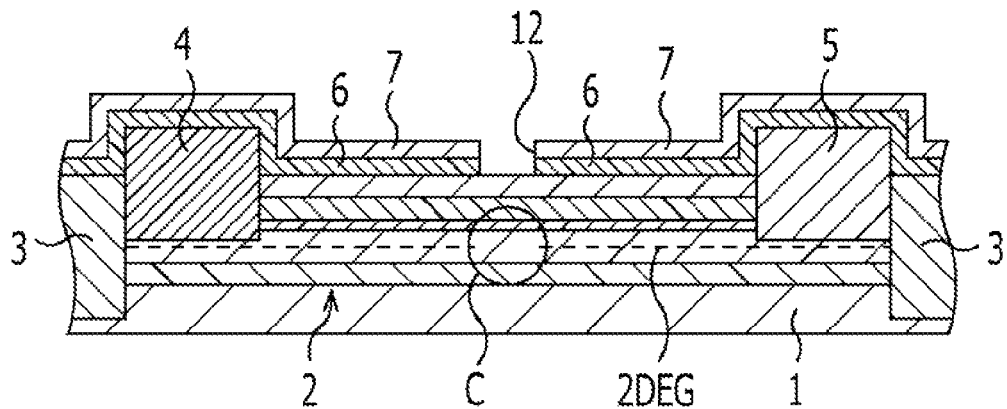
FIGS. 4A to 4C are sectional views illustrating major steps of forming an AlGaN/GaN HEMT of a Schottky structure (hereinafter referred to as "AlGaN/GaN Schottky-HEMT") in accordance with Embodiment 3.
Figure 4B:
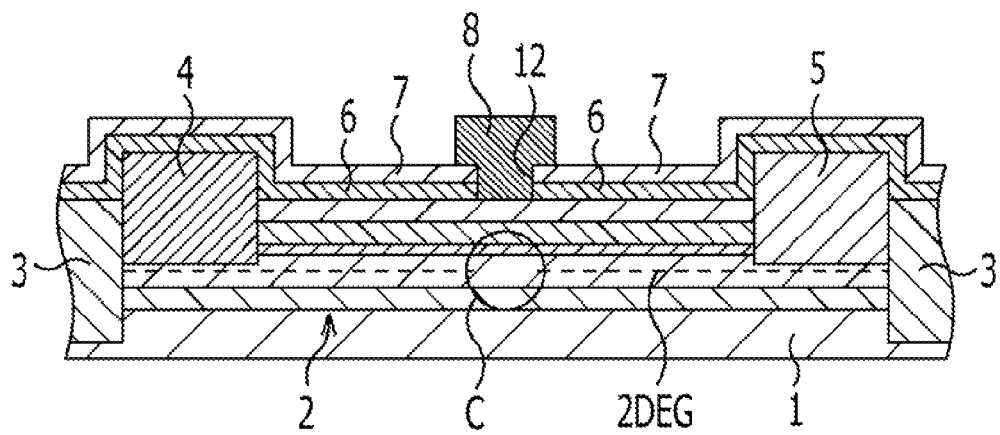
Figure 4C:
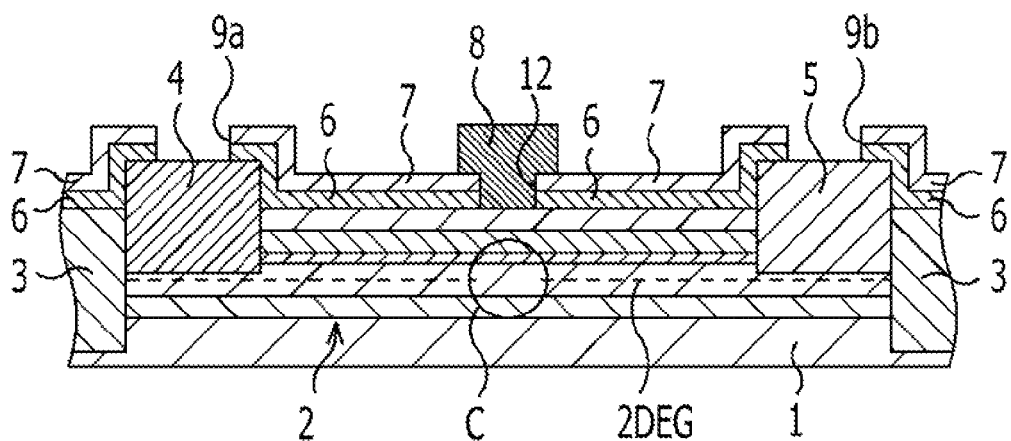

FIGS. 4A to 4C are sectional views illustrating major steps of forming the AlGaN/GaN Schottky-HEMT in accordance with Embodiment 3.

As in Embodiment 1, the first film 6 and the second film 7 are formed over the compound semiconductor layer 2 through the steps illustrated in FIGS. 1A to 1E as in Embodiment 1.

Subsequently, an opening 12 is formed in the first film 6 and the second film 7 as illustrated in FIG. 4A.

First, a resist is coated over the second film 7. The resist is treated by lithography, thereby forming an opening at the location where a gate electrode is to be formed. A resist mask is formed thereby so as to form the opening at the surface of the second film 7 that corresponds to the location where a gate electrode is to be formed.

The second film 7 and the first film 6 are etched by using the resist mask until the surface of a cap layer 2e is exposed. Dry etching using fluorine-based gas as an etching gas, and wet etching using a fluorine etchant are carried out. Thus, the opening 12 is formed in the first film 6 and the second film 7.

The resist mask is removed by ashing or the like.

When the opening 12 is formed in the first film 6 and the second film 7 as illustrated in FIG. 4A, the first film 6 and the second film 7 are removed at the opening 12. Neither first film 6 nor second film 7 is provided at the location described above over the compound semiconductor layer 2. Thus, 2DEG at the electron transport layer 2b dissipates at a region below the opening 12 (illustrated in a circle C in FIG. 4A).

A gate electrode 8 is then formed as illustrated in FIG. 4B.

A lower layer resist (for example, PMGI (trade name) of MicroChem. Corp.) and an upper layer resist (for example, PFI32-A8 (trade name) of Sumitomo Chemical Co., Ltd.) are coated over the second film 7, including the opening 12 by, for example, spin coating. An opening of, for example, about 0.8 μm in diameter is formed in the upper layer resist by an ultraviolet ray exposure at the location where a gate electrode is to be formed including the opening 12. Then, the lower layer resist is wet-etched with an alkali developer while using the upper layer resist as a mask. Subsequently, while the upper layer resist and the lower layer resist are used as a mask, a gate metal of Ni/Au in which Ni is about 10 nm thick and Au is about 300 nm thick, is deposited over an entire surface including the inside of the opening. Then, lift-off is carried out with a heated organic solvent, thereby removing the lower layer resist, the upper layer resist and the gate metal over the upper layer resist. The gate electrode 8 is thus formed in which the opening 7a is embedded with a portion of the gate metal. In the opening 12, the gate electrode 8 is Schottky-connected to the compound semiconductor layer 2.

As illustrated in FIG. 4C, the contact hole 9a for the source electrode 4 and the contact hole 9b for the drain electrode 5 are formed in the first film 6 and the second film 7.

The contact holes 9a and 9b are formed in the second film 7 and the first film 6 so as to expose a portion of the surface of the source electrode 4 and the drain electrode 5 by lithography and dry etching.

Instead, a certain protective film may be first formed over the second film 7 so as to cover the gate electrode 8, and then each contact hole may be formed in the protective film, the second film 7 and the first film 6.

After wiring the source electrode 4, the drain electrode 5 and the gate electrode 8, an AlGaN/GaN Schottky-HEMT is formed.

When voltage is not applied to the gate electrode 8 (in an OV state) as illustrated in FIG. 4C, 2DEG at the electron transport layer 2 of the compound semiconductor layer 2 dissipates at a region below the gate electrode 8 that corresponds to a channel region (illustrated in a circle C in FIG. 4C). This indicates that normally-off is achieved at AlGaN/GaN HEMT in the embodiment.

Though the SiC substrate 1 is used in Embodiments 1 to 3, another material such as sapphire, Si and GaAs can be used for a substrate. Moreover, the substrate may be semi-insulating or conducting. The structure of the source electrode 4, drain electrode 5 and gate electrode 8 in Embodiments 1 to 3 is an example, and may have a single-layer, multi-layer or other. The methods used when forming the source electrode 4 and the drain electrode 5 in Embodiments 1 to 3 are examples. The heat treatment in Embodiments 1 to 3 may be unnecessary if the Ohmic characteristics are obtained. Another heat treatment may also be carried out after forming the gate electrode 8.

Embodiment 4

This embodiment discloses a power supply device having an AlGaN/GaN HEMT selected from Embodiments 1 and 2.

Figure 5:
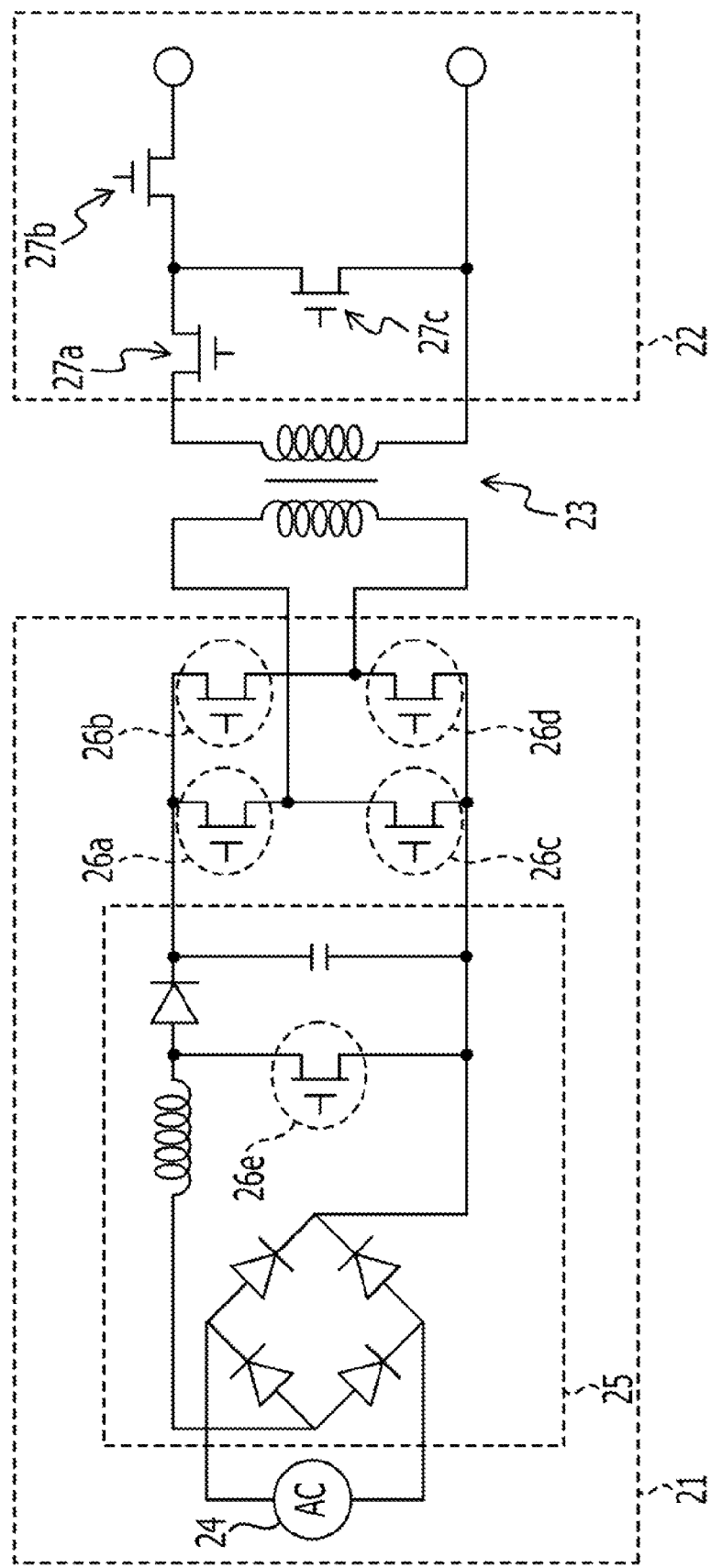
FIG. 5 is a diagram illustrating a schematic structure of a power supply device in accordance with Embodiment 4.

FIG. 5 is a circuit diagram illustrating a schematic structure of the power supply device in accordance with Embodiment 4.

The power supply device of the embodiment includes a primary side circuit 21 of high voltage, a secondary side circuit 22 of low voltage, and a transformer 23 between the primary side circuit 21 and the secondary side circuit 22.

The primary side circuit 21 includes an AC power supply 24, a so-called bridge rectifying circuit 25, and a plurality of switching elements 26a, 26b, 26c and 26d. The bridge rectifying circuit 25 includes a switching element 26e.

The secondary side circuit 22 includes a plurality of switching elements 27a, 27b and 27c.

In the embodiment, each of the switching elements 26a, 26b, 26c, 26d and 26e of the primary side circuit 21 is an AlGaN/GaN HEMT selected from Embodiments 1 and 2. Each of the switching elements 27a, 27b and 27c of the secondary side circuit 22 is a regular MIS-FET using silicon.

In the embodiment, a highly reliable AlGaN/GaN HEMT is applied to a high-voltage circuit that can perform an accurate normally-off operation with a relatively simple structure even without a trench for a gate electrode at the compound semiconductor layer 2. Thus, a highly reliable high-power power circuit is provided.

Embodiment 5

This embodiment discloses a high frequency amplifier having an AlGaN/GaN HEMT selected from Embodiments 1 and 2.

Figure 6:
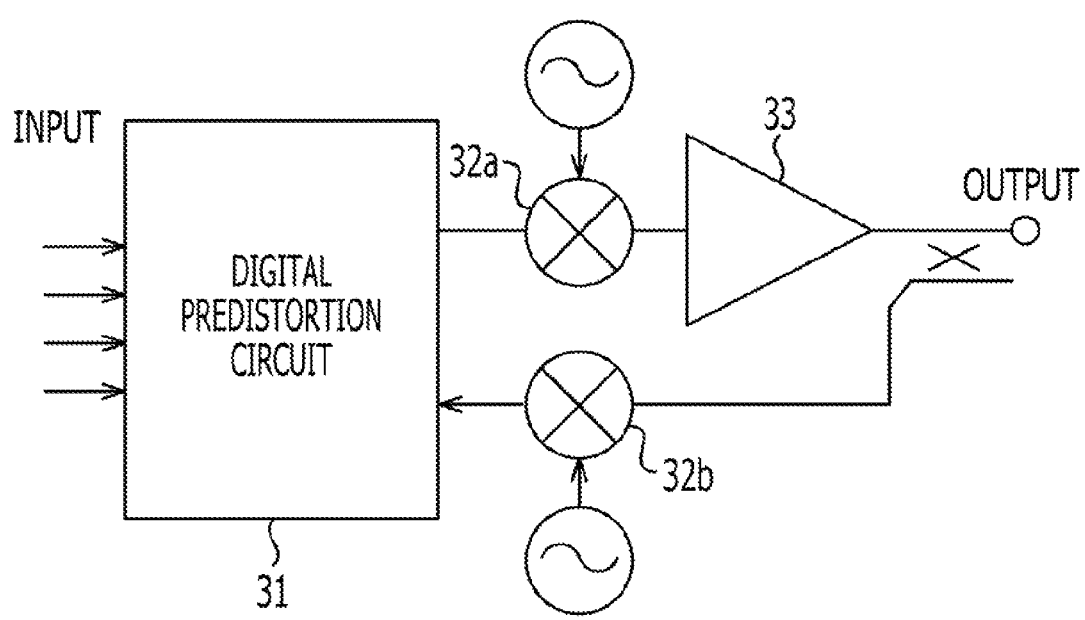
FIG. 6 is a diagram illustrating a schematic structure of a high-frequency amplifier in accordance with Embodiment 5.

FIG. 6 is a circuit diagram illustrating a schematic structure of a high frequency amplifier in accordance with Embodiment 5.

The high frequency amplifier of the embodiment includes a digital predistortion circuit 31, mixers 32a and 32b, and a power amplifier 33.

The digital predistortion circuit 31 compensates for the nonlinear distortion of input signals. The mixer 32a mixes the input signals whose nonlinear distortion is compensated for, with AC signals. The power amplifier 33 amplifies the input signals that are mixed with AC signals, and has an AlGaN/GaN HEMT selected from Embodiments 1 and 2. In FIG. 6, signals on the output side are mixed, by switching, with AC signals at the mixer 32b, and then transmitted to the digital predistortion circuit 31.

In the embodiment, a highly reliable AlGaN/GaN HEMT is applied to a high-frequency amplifier that can perform an accurate normally-off operation with a relatively simple structure even without a trench for a gate electrode at the compound semiconductor layer 2. Therefore, a highly reliable high-frequency amplifier with a high withstand voltage is provided.

Other Embodiments

Embodiments 1 to 5 illustrate the AlGaN/GaN HEMT as an exemplary compound semiconductor device. In addition to the AlGaN/GaN HEMT, the following HEMTs are also applicable as a compound semiconductor device.

Example 1

This example discloses an InAlN/GaN HEMT as a compound semiconductor device.

InAlN and GaN are compound semiconductors that may have close lattice constants based on the compositions. In Embodiments 1 to 4 described above, the electron transport layer may be i-GaN; the intermediate layer may be i-InAlN; the electron supply layer may be n-InAlN; and the cap layer may be n-GaN. Since piezoelectric polarization hardly occurs, a two-dimensional electron gas is generated due to the spontaneous polarization of InAlN.

In the example, a highly reliable InAlN/GaN HEMT, like the AlGaN/GaN HEMT described above, is provided that performs an accurate normally-off operation with a relatively simple structure even without a trench for a gate electrode at a compound semiconductor.

Example 2

This example discloses an InAlGaN/GaN HEMT as a compound semiconductor device.

GaN and InAlGaN are compound semiconductors in which InAlGaN has a smaller lattice constant than GaN. In Embodiments 1 to 4 described above, the electron transport layer may be i-GaN; the intermediate layer may be i-InAlGaN; the electron supply layer may be n-InAlGaN; and the cap layer may be $n^+$-GaN.

In the example, a highly reliable InAlGaN/GaN HEMT is provided that performs an accurate normally-off operation with a relatively simple structure even without a trench for a gate electrode at a compound semiconductor.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present invention have been described in detail, it should be understood that various changes, substitutions, and alterations could be made hereto without departing from the spirit and scope of the invention.

What is claimed is:
1. A compound semiconductor device comprising:
a compound semiconductor layer;

a first film formed over the compound semiconductor layer, the first film being in a negatively charged state or a non-charged state at an interface with the compound semiconductor layer;

a second film formed over the first film, the second film being in a positively charged state at an interface with the first film; and a gate electrode embedded in an opening formed in the second film, wherein the first film contains aluminum nitride.

2. The compound semiconductor device according to claim 1, wherein the aluminum nitride of the first film has a polycrystalline structure.

3. The compound semiconductor device according to claim 1, wherein the compound semiconductor layer includes an electron transport layer at which two-dimensional gas is generated, and an electron supply layer over the electron transport layer; and wherein the electron supply layer has a thickness and a composition to prevent the two-dimensional gas from being generated at the electron transport layer while a surface of the compound semiconductor layer is exposed.

4. The compound semiconductor device according to claim 1, further comprising:

a third film formed over the second film and covering an inner wall surface of the opening formed in the second film, wherein the gate electrode is formed over the third film embedded in the opening.

5. A method of manufacturing a compound semiconductor device, comprising:

forming a first film over a compound semiconductor layer, the first film being a negatively-charged state or a non-charged state at an interface with the compound semiconductor layer;

forming a second film over the first film, the second film being a positively-charged state at an interface with the first film;

forming an opening in the second film; and forming a gate electrode embedded in the opening, wherein the first film contains aluminum nitride.

6. The method according to claim 5, wherein the compound semiconductor layer includes an electron transport layer at which two-dimensional gas is generated, and an electron supply layer over the electron transport layer; and wherein the electron supply layer is formed before forming the first film so as to have a thickness and a composition to prevent the two-dimensional gas from being generated at the electron transport layer while a surface of the compound semiconductor layer is exposed.

7. The method according to claim 5, further comprising:

forming a third film over the second film so as to cover an inner wall surface of the opening after forming the opening in the second film, wherein the gate electrode is formed over the third film embedded in the opening.

8. The method according to claim 5, wherein the first film and the second film are formed by atomic layer deposition.

9. The method according to claim 5, wherein the aluminum nitride of the first film has a polycrystalline structure.

10. The compound semiconductor device according to claim 1, wherein the second film contains at least one compound selected from the group consisting of aluminum oxide, aluminum oxynitride, silicon oxide, silicon nitride, silicon oxynitride, boron nitride, hafnium oxide, hafnium nitride and hafnium oxynitride.

11. The compound semiconductor device according to claim 1, further comprising:

a source electrode provided on one side of the gate electrode; and a drain electrode provided on another side of the gate electrode, wherein a part of the first film is provided on upper surfaces of the source electrode and the drain electrode.

12. The method according to claim 7, wherein the second film contains at least one compound selected from the group consisting of aluminum oxide, aluminum oxynitride, silicon oxide, silicon nitride, silicon oxynitride, boron nitride, hafnium oxide, hafnium nitride and hafnium oxynitride.

13. The method according to claim 5, further comprising:

forming a source electrode provided on one side of the gate electrode; and forming a drain electrode provided on another side of the gate electrode, wherein a part of the first film is provided on upper surfaces of the source electrode and the drain electrode.

* * * * *